(12) United States Patent
Maki et al.

(10) Patent No.: US 9,212,419 B2
(45) Date of Patent: Dec. 15, 2015

(54) SPUTTERING TARGET FOR FORMING WIRING FILM OF FLAT PANEL DISPLAY

(75) Inventors: Kazunari Maki, Saitama (JP); Kenichi Yaguchi, Ageo (JP); Yosuke Nakasato, Osaka (JP); Haruhiko Asao, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 426 days.

(21) Appl. No.: 12/737,550

(22) PCT Filed: Jul. 31, 2009

(86) PCT No.: PCT/JP2009/003666
§ 371 (c)(1),
(2), (4) Date: Jun. 1, 2011

(87) PCT Pub. No.: WO2010/013497
PCT Pub. Date: Feb. 4, 2010

(65) Prior Publication Data
US 2011/0281134 A1   Nov. 17, 2011

(30) Foreign Application Priority Data

Aug. 1, 2008 (JP) ................................. P2008-199559
Jul. 2, 2009 (JP) ................................. P2009-157493

(51) Int. Cl.
| | | |
|---|---|---|
| *C23C 14/34* | (2006.01) | |
| *C22C 9/00* | (2006.01) | |
| *C22C 9/01* | (2006.01) | |
| *C22C 9/05* | (2006.01) | |
| *C23C 14/16* | (2006.01) | |
| *H01L 21/285* | (2006.01) | |
| *H01L 23/532* | (2006.01) | |
| *H05K 1/09* | (2006.01) | |
| *C23C 14/14* | (2006.01) | |
| *H05K 1/03* | (2006.01) | |
| *H05K 3/16* | (2006.01) | |

(52) U.S. Cl.
CPC .............. *C23C 14/3414* (2013.01); *C22C 9/00* (2013.01); *C22C 9/01* (2013.01); *C22C 9/05* (2013.01); *C23C 14/14* (2013.01); *C23C 14/165* (2013.01); *H01L 21/2855* (2013.01); *H01L 23/53233* (2013.01); *H05K 1/09* (2013.01); *H01L 2924/0002* (2013.01); *H05K 1/0306* (2013.01); *H05K 3/16* (2013.01); *Y10T 428/12431* (2015.01)

(58) Field of Classification Search
CPC .............. C22C 9/00; C22C 9/01; C22C 9/05; C23C 14/165; C23C 14/3414
USPC .......................................................... 148/432
See application file for complete search history.

(56) References Cited

U.S. PATENT DOCUMENTS

| 7,335,596 B2 * | 2/2008 | Onishi et al. .................. 438/687 |
| 2004/0004288 A1 * | 1/2004 | Sekiguchi ..................... 257/758 |

FOREIGN PATENT DOCUMENTS

| CN | 1985014 A | | 6/2007 |
| CN | 101473059 A | | 7/2009 |
| JP | 57-060043 A | | 4/1982 |
| JP | 57060043 A | * | 4/1982 |
| JP | 06-097164 A | | 4/1994 |
| JP | 09-043628 A | | 2/1997 |
| JP | 10219372 A | * | 8/1998 |
| JP | 11054458 A | * | 2/1999 |
| JP | 2000-034562 A | | 2/2000 |
| JP | 2000-239836 A | | 9/2000 |
| JP | 2001-220667 A | | 8/2001 |
| JP | 2004-076079 A | | 3/2004 |
| JP | 2004-076080 A | | 3/2004 |
| JP | 2007027259 A | * | 2/2007 |
| TW | 574393 B | | 2/2004 |

OTHER PUBLICATIONS

Machine translation of JP10219372A, Aug. 1998.*
NPL: English Machine translation of JP2007027259A, Feb. 2007.*
NPL: English translation of JP57060043, Apr. 10, 1982.*
Office Action dated Sep. 25, 2012, issued for the Chinese Patent Application No. 200980139268.0 and English translation thereof.
International Search Report dated Sep. 1, 2009, issued for PCT/JP2009/003666.
Office Action dated Apr. 14, 2014, issued for the Taiwanese patent application No. 098126040 and English translation thereof.

* cited by examiner

*Primary Examiner* — Jie Yang
(74) *Attorney, Agent, or Firm* — Locke Lord LLP; James E. Armstrong, IV; Nicholas J. DiCeglie, Jr.

(57) ABSTRACT

A copper alloy wiring film of a flat panel display of the present invention and a sputtering target for forming the same have a composition including Mg: 0.1 to 5 atom %; either one or both of Mn and Al: 0.1 to 11 atom % in total; and Cu and inevitable impurities as the balance, and if necessary, may be further including P: 0.001 to 0.1 atom %.

2 Claims, No Drawings

SPUTTERING TARGET FOR FORMING WIRING FILM OF FLAT PANEL DISPLAY

TECHNICAL FIELD

The present invention relates to a sputtering target capable of forming a wiring film of a flat panel display having a uniform specific electrical resistance over the whole surface thereof, and a wiring film of a flat panel display that is formed using the target.

The present application claims priority on Japanese Patent Application No. 2008-199559 filed on Aug. 1, 2008 and Japanese Patent Application No. 2009-157493 filed on Jul. 2, 2009, the contents of which are incorporated herein by reference.

BACKGROUND ART

A copper alloy wiring film is used as a wiring film of a flat panel display such as a liquid crystal display, a plasma display, an organic EL display, and an inorganic EL display, and for example, a liquid crystal display device is known in which a copper alloy wiring film containing 1 to 5 atom % of Mg, and Cu and inevitable impurities as the balance is formed (see Patent Document 1).

Furthermore, a copper alloy wiring film, which contains either one of 1 atom % or less of Al, 0.5 atom % or less of Si, 2 atom % or less of Be, 2 atom % or less of Cr, 2 atom % or less of Mg, 0.5 atom % or less of Sn, 4 atom % or less of Zn, and 2 atom % or less of Ce, as an addition element, is known to have excellent migration resistance. It is also known that the copper alloy wiring film is formed by sputtering using a target containing the same components as the copper alloy wiring film (see Patent Document 2).

The copper alloy wiring film in the flat panel display is formed on a glass substrate by sputtering, and then the film is subjected to a heat treatment. When the heat treatment is performed, the addition element included in the copper alloy wiring film becomes an oxide and is moved to a front surface and a rear surface of the copper alloy wiring film. Thereby, oxide layers of the addition element are formed in the front surface and the rear surface of the copper alloy wiring film. The formed oxide layer of the addition element prevents Si or the like, which is a basic component of the glass substrate, from diffusing and penetrating into the copper alloy wiring film; and thereby, an increase in the resistivity of the copper alloy wiring film is inhibited. In addition, the formed oxide layer of the addition element improves the adhesion property of the copper alloy wiring film relative to the glass substrate.

PRIOR ART DOCUMENTS

Patent Documents

Patent Document 1: Japanese Unexamined Patent Application, First Publication No. H09-43628
Patent Document 2: Japanese Unexamined Patent Application, First Publication No. H06-97164

DISCLOSURE OF THE INVENTION

Problems to be Solved by the Invention

Recently, flat panel displays have become increasingly larger, and large liquid crystal panels having sizes of 50 inches or more have come to be mass produced. For this reason, the copper alloy wiring film is formed on a wide glass substrate surface by the sputtering. However, in the copper alloy wiring film formed on the wide glass substrate surface by the sputtering, the resistivity value (specific electrical resistance) varies from area to area, and this tendency remarkably occurs in the copper alloy wiring film formed by using a Mg-containing copper alloy target.

Means for Solving the Problems

Thus, the inventors developed a target formed of Mg-containing copper alloy capable of forming a copper alloy wiring film in which a variation in the resistivity value from area to area is small, and the inventors carried out research in order to obtain the copper alloy wiring film in the flat panel display by using the target. As a result, the inventors have found that a copper alloy thin film, which is obtained by sputtering using a copper alloy target including: pure copper (especially, oxygen-free copper having a purity of 99.99% or more); Mg: 0.1 to 5 atom %; and either one or both of Mn and Al: 0.1 to 11 atom % in total, has a smaller variation in the resistivity value and more uniform resistivity value as a whole than those of a copper alloy thin film of the related art which is obtained by sputtering using a copper alloy target including Mg: 1 to 5 atom %, and Cu and inevitable impurities as the balance.

The present invention was made based on the above-mentioned research results and has the following features.

According to a first embodiment, there is provided a sputtering target for forming a wiring of a flat panel display that has a composition including: Mg: 0.1 to 5 atom %; either one or both of Mn and Al: 0.1 to 11 atom % in total; and Cu and inevitable impurities as the balance.

According to another embodiment, there is provided a wiring film of a flat panel display consisting of a copper alloy thin film which is obtained by sputtering using the sputtering target described in the first embodiment, and has a composition including: Mg: 0.1 to 5 atom %; either one or both of Mn and Al: 0.1 to 11 atom % in total; and Cu and inevitable impurities as the balance.

The copper alloy thin film which configures the wiring of the flat panel display is manufactured by sputtering using the target. The target is manufactured by, for example, the following mariner. At first, oxygen-free copper having a purity of 99.99% or more is melted in a high-purity graphite crucible by induction heating under an inert gas atmosphere. Then, Mg at an amount in a range of 0.1 to 5 atom %, and either one or both of Mn and Al at a total amount in a range of 0.1 to 11 atom % are added to the molten copper. The obtained molten metal is casted and solidified under an inert gas atmosphere. The cast is subjected to hot rolling and stress relief annealing. The copper alloy thin film for the flat panel display can be formed by jointing the obtained target to a backing plate and performing sputtering under normal conditions.

The reasons for limiting the ranges of the component compositions of the sputtering target of the present invention and the copper alloy thin film formed using the target as mentioned above will be described.

(a) Component Composition of Target

The reasons for limiting the amount of Mg to be in a range of 0.1 to 5 atom % and limiting the total amount of either one or both of Mn and Al to be in a range of 0.1 to 11 atom % which are contained in a target are as follows. In the case where a copper alloy thin film is formed by sputtering using a target which contains Mg: 0.1 to 5 atom % together with either one or both of Mn and Al: 0.1 to 11 atom % in total, a variation in the resistivity value from area to area becomes small. In the case where the amount of Mg is in a range of less than 0.1 atom % or the total amount of either one or both of Mn and Al is in a range of less than 0.1 atom %, the desired effects are not attained; and therefore, this case is not preferable. In the case where the amount of Mg is in a range of more than 5 atom % or the total amount of either one or both of Mn and Al is in a range of more than 11 atom %, a further improvement in desired characteristics is not recognized, and, in addition, a resistance of the formed copper alloy thin film increases; and therefore, this case is not preferable.

(b) Component Composition of Copper Alloy Thin Film

Mg:

Mg makes grains fine, and Mg suppresses the generation of thermal defects such as hillocks and voids in a copper alloy thin film which configures a wiring film in a flat panel display. As a result, migration resistance is improved. In addition, Mg forms a Mg oxide layer on a front surface and a rear surface of the copper alloy thin film during a heat treatment to prevent Si or the like, which is a main component of a glass substrate, from dispersing and penetrating into the copper alloy wiring film. As a result, an increase in the resistivity value of the copper alloy wiring film is prevented, and the adhesion property of the copper alloy wiring film to the glass substrate is also improved. In the case where the amount of Mg is in a range of less than 0.1 atom %, desired effects are not attained; and therefore, this case is not preferable. In the case where the amount of Mg is in a range of more than 5 atom %, an improvement in the property is not recognized, and in addition, the resistivity value is increased; and thereby, a suitable function as the wiring film is not exhibited. Therefore, this case is not preferable. Thus, the amount of Mg contained in the copper alloy thin film is set to be in a range of 0.1 to 5 atom %.

Mn and Al:

By containing these components along with Mg, a multiple oxide or an oxide solid solution which includes Mg with Mn and/or Al is formed in the front surface and the rear surface of the copper alloy thin film; and thereby, the adhesion property to the surface of the glass substrate is further improved. Furthermore, since an oxide which is formed in the front surface and the rear surface of the copper alloy thin film contains the multiple oxide or the oxide solid solution which includes Mg with Mn and/or Al having high chemical stability, the chemical stability of the copper alloy wiring is improved. In the case where either one or both of these components are added at a total amount in a range of less than 0.1 atom %, the effect of improving the adhesion property cannot be obtained; and therefore, this case is not preferable. In the case where Mn and Al are added at an amount in a range of more than 11 atom % in total, an improvement in the property is not recognized, and in addition, the resistivity value of the wiring film increases; and therefore, this case is not preferable.

P:

A small amount of P facilitates the casting property of a copper alloy without deteriorating the properties such as the resistivity, the hillocks, the voids and the adhesion property required for the copper alloy thin film; and therefore, P is added as necessary. However, in the case where P is added at an amount in a range of less than 0.001 atom %, there is no effect thereof. In the case where P is added at an amount in a range of more than 0.1 atom %, there is no improvement in the casting property. Thus, the amount of P is set to be in a range of 0.001 to 0.1 atom %.

Effects of the Invention

In the case where a copper alloy thin film is formed by sputtering using the target of the present invention, even if a glass substrate becomes larger, a variation in the resistivity value from area to area in the formed copper alloy thin film is small. In addition, the adhesion property to the glass substrate surface is improved, and the resistivity value is low. Therefore, it is possible to form a copper alloy wiring film of a high-definition and large flat panel display.

BEST MODE FOR CARRYING OUT THE INVENTION

Oxygen-free copper having a purity of 99.99 mass % was prepared, and the oxygen-free copper was melted in a high-purity graphite crucible by induction heating under an Ar gas atmosphere. Mg, Mn and Al were added to the obtained molten copper, and P was added as necessary. These metals were melted, and the composition thereof was adjusted so as to obtain molten metals having the component compositions shown in Table 1. The obtained molten metals were casted by a cooled carbon mold. The casts were subjected to hot rolling and stress relief annealing. The surfaces of the obtained rolled products were processed by a lathe to produce copper alloy sputtering targets of the present invention (hereinafter, referred to as targets of the present invention) 1 to 25, comparison copper alloy sputtering targets (hereinafter, referred to as comparison targets) 1 to 4, and a sputtering target of the related art (hereinafter, referred to as a target of the related art) 1 which had a circular plate shape and a size of an outer diameter: 200 mm×a thickness: 10 mm and the component compositions shown in Table 1.

Backing plates formed of oxygen-free copper were prepared, and each of the targets of the present invention 1 to 25, the comparison targets 1 to 4, and the target of the related art 1 was overlapped with the backing plate formed of oxygen-free copper, and was soldered by indium at 200° C.; and thereby, each of the targets of the present invention 1 to 25, the comparison targets 1 to 4, and the target of the related art 1 was jointed to the backing plate formed of oxygen-free copper to produce the backing plate target.

The backing plate target obtained by soldering each of the targets of the present invention 1 to 25, the comparison targets 1 to 4, and the target of the related art 1 to the backing plate formed of oxygen-free copper was disposed such that a distance between the target and a glass substrate (a glass substrate 1737 produced by Corning Company having sizes of diameter: 200 mm and thickness: 0.7 mm) became 70 mm.

Copper alloy wiring thin films of the present invention (hereinafter, referred to as wiring thin films of the present invention) 1 to 25, comparison copper alloy wiring thin films (hereinafter, referred to comparison wiring thin films) 1 to 4, and a copper alloy wiring thin film of the related art (hereinafter, referred to as a wiring thin film of the related art) 1 were formed on surfaces of the glass substrates under the following conditions:

power supply: direct current;
sputter power: 600 W;
an attained degree of vacuum: $4 \times 10^{-5}$ Pa;
atmosphere gas composition: a mixture gas of Ar: 90 volume % and oxygen: 10 volume %;

a gas pressure: 0.2 Pa; and a glass substrate heating temperature: 150° C.

The copper alloy wiring thin films had a circular shape, a diameter of 100 mm, a thickness of 300 nm, and component compositions shown in Tables 2 and 3. The obtained wiring thin films of the present invention 1 to 25, the comparison wiring thin films 1 to 4 and the wiring thin film of the related art 1 were charged in a heating furnace, respectively, and were subjected to a heat treatment in an Ar atmosphere under conditions where the temperature rising rate was 5° C./min, the maximum temperature was 350° C., and the holding time was 30 minutes. With regard to each of the obtained circular wiring thin films of the present invention 1 to 25, the obtained circular comparison wiring thin films 1 to 4 and the obtained circular wiring thin film of the related art 1, the resistivities were measured by a four probe method at the center, at a point distant from the center by 50 mm and at a point distant from the center by 100 mm, and the difference between the maximum value and the minimum value was obtained. The results are shown in Tables 2 and 3, and the variation in the resistivity value of the wiring thin film was evaluated.

In addition, a cross-cut adhesion test was performed in accordance with JIS-K5400 as follows. Equally spaced cut lines were made at 1 mm intervals in a grid arrangement in each of the wiring thin films of the present invention 1 to 25, the comparison wiring thin films 1 to 4 and the wiring thin film of the related art 1. Then, a scotch tape manufactured by 3M Company was put on the surface of the wiring thin film and was peeled off. Thereafter, an area ratio (area %) of the wiring thin film remained to adhere to the glass substrate within a 10-mm-square in a center portion of the glass substrate was measured. The results are shown in Tables 2 and 3, and the adhesion properties to the glass substrate, of the wiring thin film of the present invention 1 to 25, the comparison wiring thin films 1 to 4 and the wiring thin film of the related art 1, were evaluated.

With regard to the wiring thin films of the present invention 1 to 25, the comparison wiring thin films 1 to 4 and the wiring thin film of the related art 1 which had been subjected to the heat treatment, five portions in each surface thereof were observed by a SEM at a magnification of 5,000, and it was observed whether or not hillocks and voids were generated. The results are shown in Tables 2 and 3.

TABLE 1

| Target | | Component composition (atom %) | | | | |
|---|---|---|---|---|---|---|
| | | Mg | Mn | Al | P | Cu and inevitable impurities |
| Present invention | 1 | 0.1 | 9.8 | — | — | balance |
| | 2 | 0.5 | 1.0 | — | — | balance |
| | 3 | 0.9 | 7.3 | — | — | balance |
| | 4 | 1.4 | 3.0 | — | — | balance |
| | 5 | 1.8 | 4.3 | — | — | balance |
| | 6 | 2.6 | 5.0 | — | — | balance |
| | 7 | 3.0 | 3.3 | — | — | balance |
| | 8 | 4.2 | 0.1 | — | — | balance |
| | 9 | 4.9 | 1.9 | — | — | balance |
| | 10 | 0.1 | — | 3.0 | — | balance |
| | 11 | 0.5 | — | 9.9 | — | balance |
| | 12 | 1.0 | — | 2.2 | — | balance |
| | 13 | 1.4 | — | 6.2 | — | balance |
| | 14 | 2.0 | — | 4.3 | — | balance |
| | 15 | 2.6 | — | 5.3 | — | balance |
| | 16 | 2.7 | — | 0.1 | — | balance |
| | 17 | 0.5 | 0.2 | 0.8 | — | balance |
| | 18 | 5.0 | 0.5 | 1.6 | — | balance |
| | 19 | 2.0 | 2.1 | 2.1 | — | balance |
| | 20 | 3.9 | 2.1 | 6.4 | — | balance |
| | 21 | 0.5 | 0.2 | 0.9 | 0.001 | balance |
| | 22 | 5.0 | 0.5 | 1.5 | 0.05 | balance |
| | 23 | 3.9 | 2.1 | 6.0 | 0.1 | balance |
| | 24 | 2.1 | — | 8.3 | — | balance |
| | 25 | 4.0 | — | 11.0 | — | balance |
| Comparison | 1 | 0.05* | 0.05* | — | — | balance |
| | 2 | 0.05* | — | 0.05* | — | balance |
| | 3 | 5.7* | 11.0* | 0.05* | — | balance |
| | 4 | 5.7* | 5.0* | 10.5* | — | balance |
| Relate art 1 | | 3.5 | —* | —* | — | balance |

*signs show values out of the ranges of the present invention.

TABLE 2

| Wiring thin film | | Used target of Table 1 | | Component composition of wiring thin film (atom %) | | | | | Measured resistivity values of wiring thin film (μΩcm) | | | | Presence of hillocks and voids | Cross-cut adhesion test Ratio of wiring thin film adhered to glass substrate (area %) |
|---|---|---|---|---|---|---|---|---|---|---|---|---|---|---|
| | | | | Mg | Mn | Al | P | Cu and inevitable impurities | Center | 50 mm from center | 100 mm from center | Difference between maximum and minimum | | |
| Present invention | 1 | Present invention | 1 | 0.1 | 7.5 | — | — | balance | 12.6 | 12.5 | 12.7 | 0.2 | none | 100 |
| | 2 | | 2 | 0.4 | 0.9 | — | — | balance | 3.1 | 3.1 | 3.2 | 0.1 | none | 100 |
| | 3 | | 3 | 0.8 | 6.0 | — | — | balance | 10.9 | 10.8 | 10.8 | 0.1 | none | 100 |
| | 4 | | 4 | 1.1 | 2.3 | — | — | balance | 5.4 | 5.4 | 5.4 | 0.0 | none | 100 |
| | 5 | | 5 | 1.4 | 3.7 | — | — | balance | 7.8 | 7.8 | 7.5 | 0.3 | none | 100 |
| | 6 | | 6 | 2.1 | 4.3 | — | — | balance | 8.5 | 8.7 | 8.8 | 0.3 | none | 100 |
| | 7 | | 7 | 2.5 | 2.9 | — | — | balance | 6.8 | 6.7 | 6.8 | 0.1 | none | 100 |
| | 8 | | 8 | 3.6 | 0.1 | — | — | balance | 3.0 | 2.9 | 3.1 | 0.2 | none | 100 |
| | 9 | | 9 | 3.9 | 1.6 | — | — | balance | 5.3 | 5.3 | 5.1 | 0.2 | none | 100 |
| | 10 | | 10 | 0.1 | — | 2.3 | — | balance | 3.1 | 3.2 | 3.1 | 0.1 | none | 100 |
| | 11 | | 11 | 0.4 | — | 7.3 | — | balance | 5.2 | 5.1 | 5.3 | 0.2 | none | 100 |
| | 12 | | 12 | 0.8 | — | 1.9 | — | balance | 3.0 | 3.1 | 3.0 | 0.1 | none | 100 |
| | 13 | | 13 | 1.2 | — | 4.5 | — | balance | 4.5 | 4.5 | 4.4 | 0.1 | none | 100 |
| | 14 | | 14 | 1.8 | — | 3.2 | — | balance | 4.0 | 4.0 | 4.1 | 0.1 | none | 100 |
| | 15 | | 15 | 2.1 | — | 3.8 | — | balance | 4.5 | 4.4 | 4.4 | 0.0 | none | 100 |

TABLE 3

| Wiring thin film | | Used target of Table 1 | | Component composition of wiring thin film (atom %) | | | | Cu and inevitable impurities | Measured resistivity values of wiring thin film (μΩcm) | | | | Presence of hillocks and voids | Cross-cut adhesion test Ratio of wiring thin film adhered to glass substrate (area %) |
|---|---|---|---|---|---|---|---|---|---|---|---|---|---|---|
| | | | | Mg | Mn | Al | P | | Center | 50 mm from center | 100 mm from center | Difference between maximum and minimum | | |
| Present Invention | 16 | Present Invention | 16 | 2.4 | — | 0.1 | — | balance | 2.6 | 2.6 | 2.6 | 0.0 | none | 100 |
| | 17 | | 17 | 0.4 | 0.2 | 0.6 | — | balance | 2.6 | 2.6 | 2.5 | 0.0 | none | 100 |
| | 18 | | 18 | 4.2 | 0.3 | 1.3 | — | balance | 4.2 | 4.2 | 4.2 | 0.0 | none | 100 |
| | 19 | | 19 | 1.7 | 1.7 | 1.5 | — | balance | 5.7 | 5.7 | 5.7 | 0.0 | none | 100 |
| | 20 | | 20 | 2.9 | 1.7 | 4.8 | — | balance | 7.7 | 7.5 | 7.7 | 0.2 | none | 100 |
| | 21 | | 21 | 0.4 | 0.2 | 0.6 | 0.001 | balance | 2.6 | 2.6 | 2.6 | 0.0 | none | 100 |
| | 22 | | 22 | 3.9 | 0.4 | 1.2 | 0.04 | balance | 4.3 | 4.3 | 4.4 | 0.1 | none | 100 |
| | 23 | | 23 | 3.2 | 1.7 | 4.6 | 0.1 | balance | 8.0 | 7.7 | 7.7 | 0.3 | none | 100 |
| | 24 | | 24 | 1.9 | — | 7.5 | — | balance | 5.7 | 5.8 | 5.6 | 0.2 | none | 100 |
| | 25 | | 25 | 3.2 | — | 9.1 | — | balance | 6.4 | 6.5 | 6.3 | 0.2 | none | 100 |
| Comparison | 1 | Comparison | 1 | 0.04* | 0.04* | — | — | balance | 2.0 | 2.0 | 2.0 | 0.0 | present | 79 |
| | 2 | | 2 | 0.04* | — | 0.04* | — | balance | 1.9 | 2.0 | 2.0 | 0.1 | present | 41 |
| | 3 | | 3 | 5.1* | 10.1* | 0.04* | — | balance | 16.4 | 16.5 | 16.9 | 0.5 | none | 100 |
| | 4 | | 4 | 5.2* | 4.4 | 9.2 | — | balance | 14.6 | 14.7 | 15.0 | 0.4 | none | 100 |
| Related Art 1 | | Related Art 1 | | 2.9 | —* | —* | — | balance | 2.7 | 3.0 | .3.7 | 1.0 | none | 59 |

*signs show values out of the range of the present invention.

The following can be understood from the results shown in Tables 1 to 3.

(i) With regard to the wiring thin film of the related art 1 which was formed by sputtering using the target of the related art 1 solely containing Mg with Cu, a difference in resistivity between the center portion and the peripheral portion is large, and the adhesion property to the glass substrate is poor. In contrast, with regard to the wiring thin films of the present invention 1 to 25 which contained Mg together with either one or both of Mn and Al, the differences in resistivity between the center portion and the peripheral portion are small; and therefore, the variations in the resistivity value are small. In addition, the adhesion properties to the glass substrate are excellent.

(ii) With regard to the comparison wiring thin film 1 which was formed by sputtering using the comparison target 1 containing Mg and Mn at amounts lower than the ranges of the present invention, and the comparison wiring thin film 2 which was formed by sputtering using the comparison target 2 containing Mg and Al at amounts lower than the ranges of the present invention, the adhesion properties are poor. Furthermore, hillocks and voids are generated. Therefore, migration may easily occur, which is not desirable. Moreover, with regard to the comparison wiring thin films 3 and 4 of which the Mg amount and the total amount of Mn and Al are higher than the ranges of the present invention, the resistivities becomes too large; and therefore, these films are not desirable as the wiring thin film.

The invention claimed is:

1. A wiring film of a flat panel display consisting of a copper alloy thin film which has a composition consisting of: Mg: 0.1 to 5 atom %; either one or both of Mn and Al: 0.6 to 11 atom % in total; and the balance of Cu and inevitable impurities,
   wherein a relation of (Al+Mn)/Mg≥0.38 is fulfilled, and
   a multiple oxide or an oxide solid solution which includes Mg with either one or both of Mn and Al is formed in a front surface and a rear surface of the wiring film.

2. A sputtering target for forming the wiring film of a flat panel display according to claim 1, having a composition consisting of: Mg: 0.1 to 5 atom %; either one or both of Mn and Al: 0.8 to 11 atom % in total; and the balance of Cu and inevitable impurities,
   wherein a relation of (Al+Mn)/Mg≥0.39 is fulfilled.

* * * * *